(12) United States Patent
BenSaleh et al.

(10) Patent No.: US 10,727,796 B2
(45) Date of Patent: Jul. 28, 2020

(54) LOW-VOLTAGE DIFFERENTIAL SIGNALING (LVDS) RECEIVER CIRCUIT AND A METHOD OF OPERATING THE LVDS RECEIVER CIRCUIT

(71) Applicant: The King Abdulaziz City for Science and Technology, Riyadh (SA)

(72) Inventors: Mohammed Sulaiman BenSaleh, Riyadh (SA); Syed Arsalan Jawed, Korangi Creek (PK); Yasir Mehmood Siddiqi, Korangi Creek (PK); Waqas Siddiqi, Korangi Creek (PK); Shahab Ahmed Najmi, Riyadh (SA)

(73) Assignee: THE KING ABDULAZIZ CITY FOR SCIENCE AND TECHNOLOGY (KACST), Riyadh (SA)

( * ) Notice: Subject to any disclaimer, the term of this patent is extended or adjusted under 35 U.S.C. 154(b) by 0 days.

(21) Appl. No.: 15/238,810

(22) Filed: Aug. 17, 2016

(65) Prior Publication Data

US 2019/0348958 A1 Nov. 14, 2019

(51) Int. Cl.
*H03F 3/45* (2006.01)
*H03F 1/34* (2006.01)
*H03F 1/32* (2006.01)
*H04B 1/16* (2006.01)

(52) U.S. Cl.
CPC ....... *H03F 3/45264* (2013.01); *H03F 1/3205* (2013.01); *H03F 1/342* (2013.01); *H04B 1/16* (2013.01); *H03F 2200/129* (2013.01); *H03F 2203/45114* (2013.01); *H03F 2203/45116* (2013.01); *H03F 2203/45288* (2013.01);

(Continued)

(58) Field of Classification Search
CPC .... H03F 3/45264; H03F 1/342; H03F 1/3205; H03F 2203/45374; H03F 2203/45116; H04B 1/16
USPC .................................................. 330/252-261
See application file for complete search history.

(56) References Cited

U.S. PATENT DOCUMENTS

| 6,169,454 B1 * | 1/2001 | Hogeboom .......... H03K 5/2481 330/253 |
| 2004/0239425 A1 * | 12/2004 | Kudo .................. H03F 3/45192 330/258 |
| 2014/0028395 A1 * | 1/2014 | Chan ...................... H03F 3/005 330/260 |

* cited by examiner

*Primary Examiner* — Khanh V Nguyen
*Assistant Examiner* — Khiem D Nguyen
(74) *Attorney, Agent, or Firm* — Steven M. Shape; Dennemeyer & Associates, LLC

(57) ABSTRACT

The invention provides a Low-voltage Differential Signaling (LVDS) receiver circuit that comprises a folded-cascode operational transconductance amplifier (OTA) that includes a pair of input branches and a pair of output branches. The pair of input branches of the folded-cascode OTA includes a p-channel metal-oxide semiconductor (PMOS) input transistor pair connected to a first supply voltage domain. The pair of output branches includes an output circuit connected to a second supply voltage domain. The LVDS receiver circuit further includes a common-mode feedback circuit connected to the pair of output branches of the folded-cascode OTA that controls the second supply voltage domain. The LVDS receiver circuit further includes a regenerative buffer circuit connected to the pair of output branches of the folded-cascode OTA and an output generated from the pair of output branches of the folded-cascode OTA directly operates the regenerative buffer circuit to produce a distortion-free output signal.

7 Claims, 3 Drawing Sheets

(52) U.S. Cl.
CPC .............. *H03F 2203/45318* (2013.01); *H03F 2203/45356* (2013.01); *H03F 2203/45374* (2013.01)

LOW-VOLTAGE DIFFERENTIAL SIGNALING (LVDS) RECEIVER CIRCUIT AND A METHOD OF OPERATING THE LVDS RECEIVER CIRCUIT

FIELD OF THE INVENTION

The invention generally relates to the field of a Low-Voltage Differential Signaling (LVDS) receiver circuit. More specifically the invention relates to an LVDS receiver circuit that employs a folded-cascode operational transconductance amplifier (OTA) in a composite first-stage design with multiple supply voltage domains incorporated within the first stage to reduce power consumption.

BACKGROUND OF THE INVENTION

Low-voltage Differential Signaling (LVDS) technology is commonly used to provide a low-power and a low-voltage alternative to other high-speed input/output (I/O) interfaces, specifically for point-to-point transmissions, such as those used in network devices within data and communication networks.

An LVDS receiver is an essential part of an LVDS transceiver that is employed for high-speed low-power differential signaling over electrical interconnects. The high-speed data transmission is widely applied to a variety of applications which may include, but need not be limited to, data transmission between chips, data transmission between integrated circuit boards and the like.

The LVDS receiver has to receive a differential signal ranging from 250 millivolt (mV) to 400 mV while accommodating a large common-mode voltage over which the differential signal ranging from 0.2V to 2.2 V resides. Also, the LVDS receiver has to regenerate this very low-voltage signal into a rail-to-rail high-edge-rate signal.

Thus, an LVDS receiver circuit has to be designed in such a way that it can accommodate a large (2 volt) common-mode input range and providing a high enough gain and bandwidth to regenerate the received low-voltage and low-edge rate signal. Further, the LVDS receiver circuit has to perform the above mentioned functions in a power-efficient and an area-efficient manner.

Conventional LVDS receiver circuit designs employ a folded-cascode operational-transconductance amplifier (OTA) as a first stage of the receiver circuit with a p-type metal oxide semiconductor (PMOS) input pair. The folded-cascode OTA provides a high gain with a targeted bandwidth while the PMOS input pair allows for a high common-mode input range.

The folded-cascode OTA is followed by a domain-shifter circuit that converts the I/O voltage to a core voltage of the receiver chip. As the LVDS receiver is a well-researched domain for integrated circuits, complementary metal oxide semiconductor (CMOS) processes going towards the deep submicron regime and the LVDS receiver circuit design employed with the PMOS input pair and the domain shifter circuit raises new challenges in accordance with the power and area used for the LVDS receiver circuit.

Therefore, in light of the above, there is a need for an LVDS receiver circuit design that further improves gain and bandwidth along with a considerable reduction in area and power consumption.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the invention.

Figure 1:
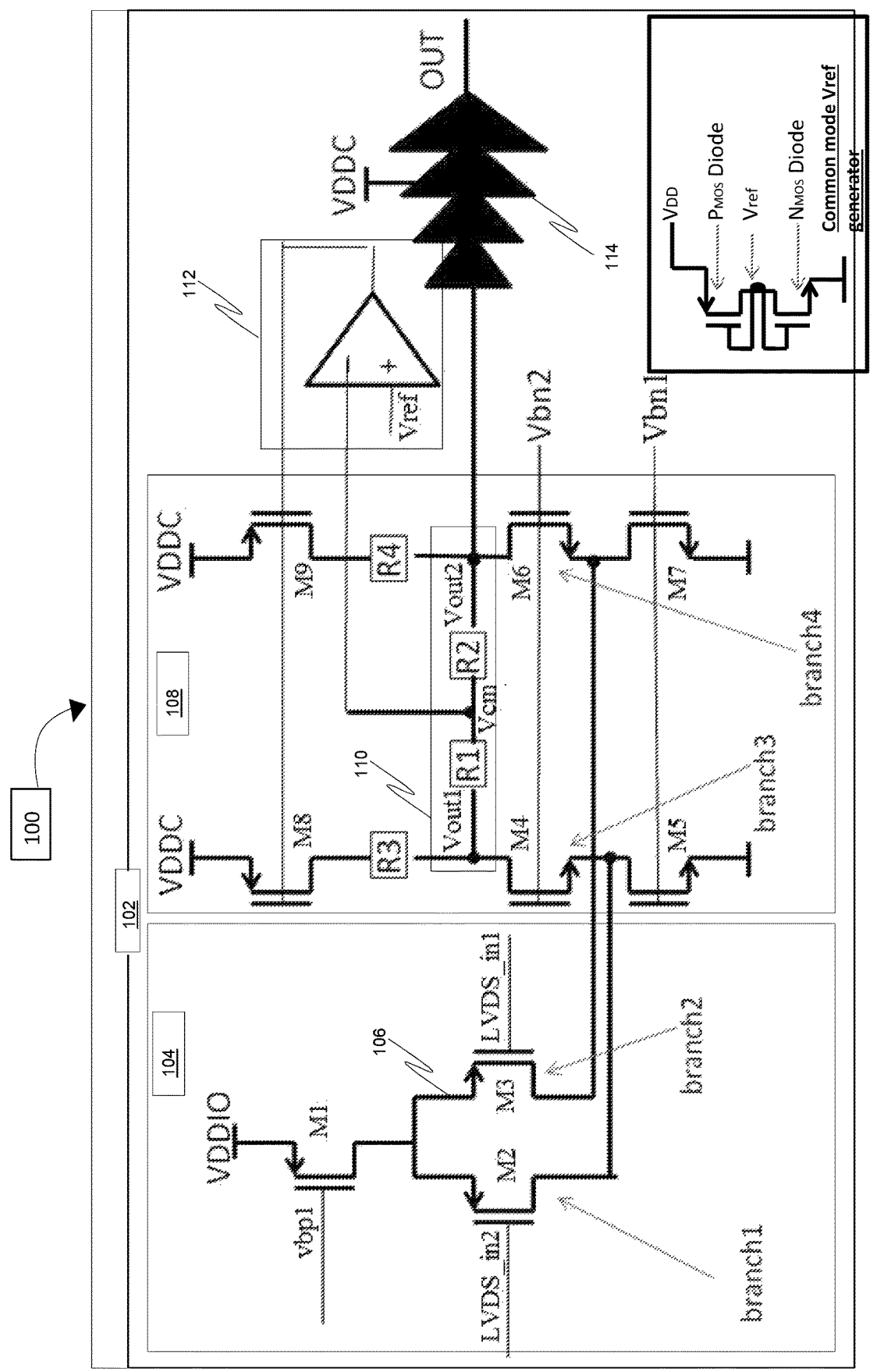
FIG. 1 illustrates a Low-voltage Differential Signaling (LVDS) receiver circuit in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE INVENTION

Before describing in detail embodiments that are in accordance with the invention, it should be observed that the embodiments reside primarily in combinations of method steps and system components related to a Low-Voltage Differential Signaling (LVDS) receiver circuit. More specifically the invention relates to an LVDS receiver circuit that employs a folded-cascode operational transconductance amplifier (OTA) in a composite first-stage design with multiple supply voltage domains incorporated within the first stage to reduce power consumption.

Accordingly, the system components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article or composition that comprises a list of elements does not include only those elements but may include other elements not expressly listed or inherent to such process, method, article or composition. An element proceeded by "comprises . . . a" does not, without more constraints, preclude the existence of additional identical elements in the process, method, article or composition that comprises the element.

Various embodiments of the invention provide an LVDS receiver circuit that includes a folded-cascode OTA that includes a pair of input branches and a pair of output branches. The folded-cascode OTA represents the first stage of the LVDS receiver circuit. A p-channel metal-oxide semiconductor (PMOS) input transistor pair is present at the pair of input branches of the folded-cascode OTA and is connected to a first supply voltage domain. Further, the pair of output branches of the folded-cascode OTA includes an output circuit that is connected to a second supply voltage domain. The LVDS receiver circuit further includes a common-mode feedback circuit connected to the pair of output branches of the folded-cascode OTA. The common-mode feedback circuit is used for regulating the second supply voltage domain by sensing a common-mode voltage at the pair of output branches of the folded-cascode OTA and comparing the common-mode voltage to a reference common-mode voltage. Based on the comparison, a feedback signal is generated that adjusts a current at the pair of output branches of the folded-cascode OTA in order to control the common-mode voltage at the pair of output branches. The output voltage from the pair of output branches of the folded-cascode OTA is then used for operating a regenerative buffer circuit connected to the pair of output branches of the folded-cascode OTA for producing a distortion-free output signal.

FIG. 1 illustrates an LVDS receiver circuit 100 in accordance with an embodiment of the invention.

As illustrated in FIG. 1, LVDS receiver circuit 100 includes a folded-cascode OTA 102 in a first stage of LVDS receiver circuit 100.

Folded-cascode OTA 102 comprises an input circuit 104 that includes a pair of input branches branch 1 and branch 2. The pair of input branches includes an input transistor M1 driven by an input vbp1 and a PMOS input transistor pair 106 to sense a complete input common-mode voltage range. PMOS input transistor pair 106 include transistors M2 and M3 driven by inputs LVDS_in2 and LVDS_in1 respectively. Input transistor M1 and PMOS input transistor pair 106 is connected to a first supply voltage VDDIO that represents a first supply voltage domain of folded-cascode OTA 102.

The outputs of PMOS input transistor pair 106 is connected to an output circuit 108 of folded-cascode OTA 102. Output circuit 108 includes a pair of output branches branch 3 and branch 4. The pair of output branches includes a series of n-channel metal-oxide semiconductor (NMOS) transistors M4, M5, M6, M7 driven by inputs Vbn1 and Vbn2. Further, output circuit 108 includes PMOS transistors M8 and M9 connected to a second supply voltage VDDC that represents a second supply voltage domain of folded-cascode OTA 102.

Output circuit 108 further includes a resistive voltage divider circuit 110 that includes resistors R1 an R2 connected to the pair of output branches. The outputs of resistive voltage divider circuit 110 are Vout1 and Vout2.

The pair of output branches also includes a pair of pull-up resistors R3 and R4 that are connected to resistive voltage divider circuit 110 and to transistors M8 and M9.

Moving on, LVDS receiver circuit 100 includes a common-mode feedback circuit 112 connected to the pair of output branches of folded-cascode OTA 102. Common-mode feedback circuit 112 includes an error amplifier that is used for controlling the second supply voltage VDDC at the pair of output branches of folded-cascode OTA 102 by sensing a common-mode voltage Vcm of folded-cascode OTA 102 using resistive voltage divider circuit 110.

Common-mode feedback circuit 112 includes a common-mode feedback control circuitry 116 and a common-mode reference generator 118.

Common-mode feedback control circuitry 116 senses the common-mode voltage Vcm at the pair of output branches of folded-cascode OTA 102 and compares the common-mode voltage Vcm that was sensed at the pair of output branches to a reference common-mode voltage Vref generated by the common-mode reference generator 118. The common-mode reference generator 118 comprises an internal circuit that includes two cascaded diodes. One of the two cascaded diodes is a PMOS diode 120 and the other is an NMOS diode 122.

Based on the comparison, the common-mode feedback control circuitry 116, then, generates a feedback signal that adjusts a current at the pair of output branches of folded-cascode OTA 102. Thus, common-mode feedback circuit 112 regulates the common-mode voltage Vcm at the pair of output branches of folded-cascode OTA 102 and maintains the second supply voltage at VDDC.

LVDS receiver circuit 100 further includes a regenerative buffer circuit 114 connected to the pair of output branches of folded-cascode OTA 102.

Regenerative buffer circuit 114 includes a series of progressively-sized cascaded inverters.

The output from the pair of output branches of folded-cascode OTA 102 operate regenerative buffer circuit 114 to produce a duty-cycle distortion-free output Also, the common-mode reference generator of common-mode feedback circuit 112 tracks process variations and enables folded-cascode OTA 102 and regenerative buffer circuit 114 to produce the duty-cycle distortion-free output.

Figure 2:
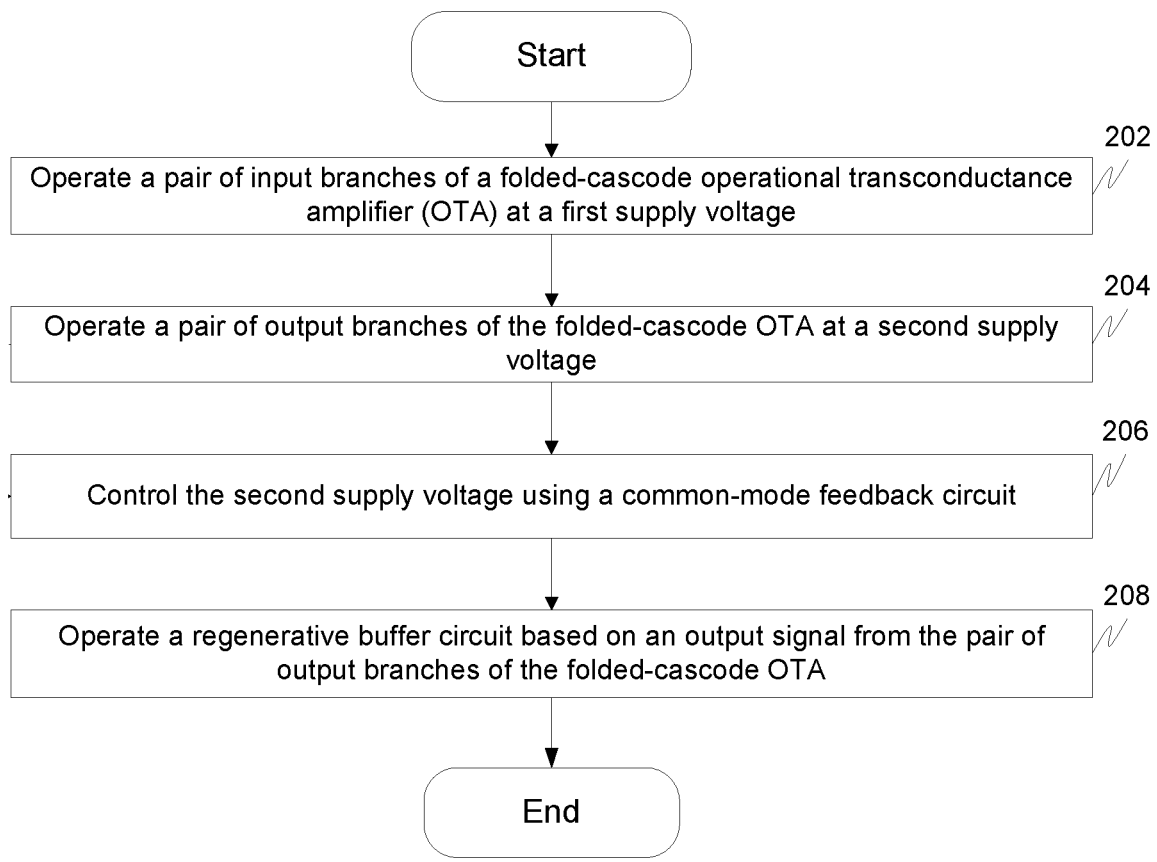
FIG. 2 illustrates a flowchart of a method for operating an LVDS receiver circuit in accordance with an embodiment of the invention.

FIG. 2 illustrates a flowchart of a method for operating LVDS receiver circuit 100 in accordance with an embodiment of the invention.

At step 202, the pair of input branches of folded-cascode OTA 102 is operated at the first supply voltage VDDIO. The pair of input branches of folded-cascode OTA 102 includes PMOS input transistor pair 106 that senses a complete input common-mode voltage and is connected to the first supply voltage VDDIO. Further, at step 204, the pair of output branches of folded-cascode OTA 102 is operated at the second supply voltage VDDC which is less than the first supply voltage VDDIO.

Moving on, at step 206, the second supply voltage VDDC is controlled using common-mode feedback circuit 112. Common-mode feedback circuit 112 includes the common-mode feedback control circuitry and the common-mode reference generator for controlling the common-mode voltage Vcm sensed at the pair of output branches of folded-cascode OTA 102. Step 206 is further described in detail in conjunction with FIG. 3.

Thereafter, at step 208, regenerative buffer circuit 114 is operated based on an output transmitted from the pair of output branches of folded-cascode OTA 102 for producing a distortion free output signal.

Figure 3:
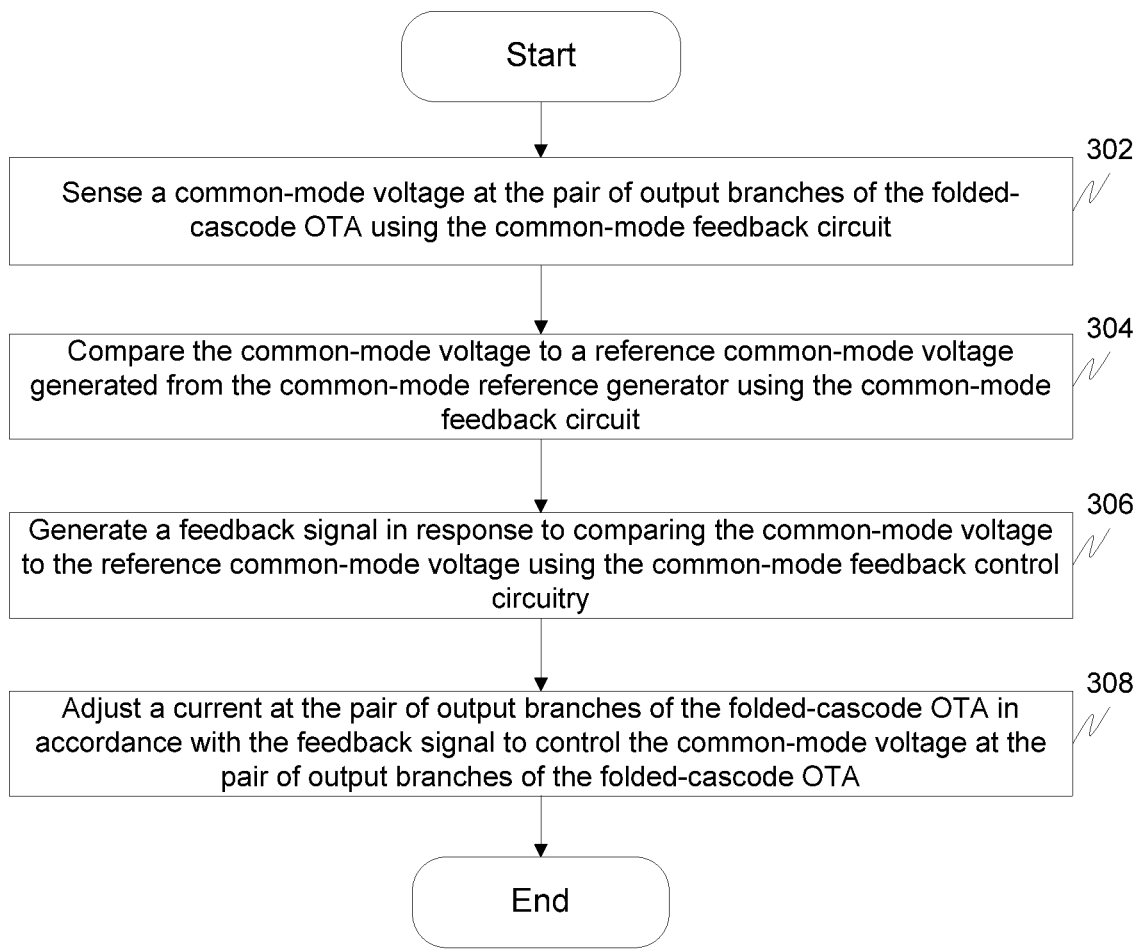
FIG. 3 illustrates a flowchart of a method for controlling a second supply voltage domain of a folded-cascode operational transconductance amplifier (OTA) of the LVDS receiver circuit using a common-feedback circuit in accordance with an embodiment of the invention.

FIG. 3 illustrates a flowchart of a method for controlling the second supply voltage VDDC at the pair of output branches of folded-cascode OTA 102 using common-feedback circuit 112 in accordance with an embodiment of the invention.

At step 302, common-mode feedback circuit 112 senses the common-mode voltage Vcm at the pair of output branches of folded-cascode OTA 102. At step 304, the common-mode voltage sensed at the pair of output branches of folded-cascode OTA 102 is compared with the reference common-mode voltage Vref generated from the common-mode reference generator. In response to comparing the common-mode voltage Vcm and the reference common-mode voltage Vref, a feedback signal is generated by common-mode feedback circuit 112 using the common-mode feedback control circuitry at step 306. The feedback signal generated at common-mode feedback circuit 112 is transmitted as feedback to the pair of output branches of output circuit 108 for controlling the second supply voltage VDDC. Further, at step 308, the feedback signal adjusts the current at the pair of output branches of folded-cascode OTA 102 in order to control the common-mode voltage Vcm at the pair of output branches of folded-cascode OTA 102.

The operation of LVDS receiver circuit 100 is further explained in detail in accordance with an exemplary embodiment of the invention as follows.

In accordance with the exemplary embodiment of the invention, PMOS input transistor pair 106 present at the pair of input branches is connected to a 3.3-volt supply voltage (VDDIO) to sense a complete input common-mode voltage ranging from 0.2 volt to 2.2 volt. In order to reduce the power consumption, after the fold in folded-cascode OTA 102, the second supply voltage VDDC is reduced to 1.8 volts using common-mode feedback circuit 112.

The output voltage of folded-cascode OTA, then, directly goes to regenerative buffer circuit 114.

In order to enable the progressively-sized cascaded inverters of regenerative buffer circuit 114 to produce a duty-cycle distortion-free output, a pull-down and pull-up resistance of the progressively-sized cascaded inverters is made equal through proper sizing of the NMOS transistors and the PMOS transistors. Further, the output voltage from the output circuit of folded-cascode OTA 102 has to be centered at half of the second supply voltage as VDDC/2 (1.8 volt/2=0.9 volt, in this case). The output voltage of folded-cascode OTA 102 is centered at VDDC/2 using common-mode feedback circuit 112 and resistive voltage divider circuit 110.

Common-mode feedback circuit 112 senses the common-mode voltage Vcm at the pair of output branches of folded-cascode OTA using the resistive voltage divider circuit 110. The sensed common-mode voltage is compared using the common feedback control circuitry with the common-mode reference common-mode voltage Vref generated from the common-mode reference generator to generate a feedback signal. The feedback signal is used to tweak the current in the pair of output branches of folded-cascode OTA 102 to adjust the common-mode voltage Vcm.

Further, the two cascaded diodes of the internal circuit of the common-mode reference generator are sized accordingly to produce VDDC/2 for the typical process corner. However, with process corners, the reference voltages generated at common-mode feedback circuit 112 displays a tolerance of ±10% across VDDC/2 and therefore the common-mode output of folded-cascode OTA 102 also displays a similar tolerance obtained at the reference voltages. As the output of folded-cascode OTA 102 is connected to a first inverter of the series of progressively sized cascaded inverters of regenerative buffer circuit 114, the first inverter also exhibits similar tolerance in a switching threshold voltage and therefore the reference voltage tolerance is nullified and a distortion free output is obtained at regenerative buffer circuit 114. Further, in order to match the tolerance of the common-mode reference generator and the first inverter of regenerative buffer circuit 114, the dimensions are kept same in both the common mode reference generator and the first inverter.

Also, for the error amplifier of common-mode feedback circuit 112, a starved current and a slow folded-cascode OTA is utilized to keep the loop stable and to maintain the closed-loop phase margin above 60°.

Further, since folded-cascode OTA 102 has a high-impedance output stage, a relatively low frequency dominant pole is created along with a lumped capacitance at the output which reduces the frequency-dependent open-loop gain of folded-cascode OTA 102 at operational frequencies around 1 Gigahertz (GHz). In order to achieve a gain greater than 4 at 1 GHz, the unity-gain-bandwidth (UGBW) of folded-cascode OTA 102 should be greater than 4 GHz. Thus, the bandwidth of folded-cascode OTA 102 is improved by employing the low-value passive pull-up resistors R3 and R4 at the pair of output branches of folded-cascode OTA 102 which appear in parallel of the pull-down small signal impedance. Thus, the pull-up resistors lower the direct current gain of folded-cascode OTA 102 which helps folded-cascode OTA 102 to avoid saturation to one of the rails in case of slow input. Thus, by avoiding the stable state due to saturation, folded-cascode OTA 102 remains near high-gain meta-stable state and therefore exhibits a higher switching speed.

The LVDS receiver circuit of the present invention utilizes multiple supply voltage domains within the first stage folded-cascode OTA in order to reduce the power consumption by 46 percent. In order to reduce the power consumption, the present invention uses a common-mode feedback circuit to control the supply voltages of the different supply voltage domains of the folded-cascode OTA. For example, as the supply voltage VDDC of folded-cascode OTA is halved, the power consumption is also reduced as the power consumed is a product of the voltage and the current drawn.

Further, a number of stages in the LVDS receiver circuit design is reduced by incorporating the domain-shifting capability within the first stage folded-cascode OTA by means of the common-mode feedback circuit.

Also, the LVDS receiver circuit of the present invention utilizes relatively low-value passive pull-up loads in the output branches of the folded-cascode OTA in order to improve the bandwidth of the folded-cascode OTA.

Thus, the LVDS receiver circuit design of the present invention is capable of accommodating a large common-mode input range and provides a high-enough gain and bandwidth to regenerate the received low-voltage and low-edge-rate signal in a power-efficient and an area-efficient manner.

Those skilled in the art will realize that the above recognized advantages and other advantages described herein are merely exemplary and are not meant to be a complete rendering of all of the advantages of the various embodiments of the invention.

In the foregoing specification, specific embodiments of the invention have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A Low-voltage Differential Signaling (LVDS) receiver circuit, comprising:
    a folded-cascode operational transconductance amplifier (OTA) that comprises a pair of input branches and a pair of output branches, the folded-cascode OTA comprising:
        a p-channel metal-oxide semiconductor (PMOS) input transistor pair present at the pair of input branches of the folded-cascode OTA, wherein the PMOS input transistor pair is connected to a first supply voltage domain;

an output circuit present at the pair of output branches of the folded-cascode OTA, wherein the output circuit is connected to a second supply voltage domain; and a pair of pull-up resistors at the pair of output branches of the folded-cascode OTA;

a common-mode feedback circuit connected to the pair of output branches of the folded-cascode OTA, wherein the common-mode feedback circuit comprises a common-mode feedback control circuitry and a common-mode reference generator; and a regenerative buffer circuit connected to the pair of output branches of the folded-cascode OTA.

2. The LVDS receiver circuit according to claim 1, further comprises a resistive voltage divider circuit at the pair of output branches of the folded-cascode OTA, the pair of pull-up resistors connected to the resistive voltage divider circuit.

3. The LVDS receiver circuit according to claim 1, wherein the common-mode feedback circuit comprises an error amplifier.

4. The LVDS receiver circuit according to claim 1, wherein the common-mode reference generator includes an internal circuit comprising two cascaded diodes, wherein a first diode of the two cascaded diodes is a PMOS diode and a second diode of the two cascaded diodes is an n-channel metal oxide semiconductor (NMOS) diode.

5. The LVDS receiver circuit according to claim 1, wherein the regenerative buffer circuit comprises a series of progressively-sized cascaded inverters that produce a distortion-free output signal.

6. A method of operating a Low-voltage Differential Signaling (LVDS) receiver circuit, the method comprising:

operating a pair of input branches of a folded-cascode operational transconductance amplifier (OTA) at a first supply voltage, wherein the pair of input branches of the folded-cascode OTA include a p-channel metal-oxide semiconductor (PMOS) input transistor pair that senses a complete input common-mode voltage range;

operating a pair of output branches of the folded-cascode OTA at a second supply voltage less than the first supply voltage, wherein an output circuit is present at the pair of output branches and connected to a second supply voltage domain to provide the second supply voltage, the pair of output branches including a pair of pull-up resistors; and controlling the second supply voltage using a common-mode feedback circuit, wherein the common-mode feedback circuit comprises a common-mode feedback control circuitry and a common-mode reference generator and wherein controlling the second supply voltage comprises:

sensing, using the common-mode feedback circuit, a common-mode voltage at the pair of output branches of the folded-cascode OTA;

comparing, using the common-mode feedback circuit, the common-mode voltage that was sensed at the pair of output branches to a reference common-mode voltage generated from the common-mode reference generator;

generating, using the common-mode feedback circuit, a feedback signal in response to comparing the common-mode voltage to the reference common-mode voltage; and adjusting a current at the pair of output branches of the folded-cascode OTA in accordance with the feedback signal in order to control the common-mode voltage at the pair of output branches of the folded-cascode OTA; and operating a regenerative buffer circuit based on an output signal from the pair of output branches of the folded-cascode OTA.

7. The method according to claim 6, wherein the common-mode feedback circuit senses the common-mode voltage at the pair of output branches of the folded-cascode OTA using a resistive voltage divider circuit.

* * * * *